(12) United States Patent
Vieira et al.

(10) Patent No.: US 7,139,490 B2
(45) Date of Patent: Nov. 21, 2006

(54) ALL-OPTICAL WAVELENGTH CONVERTER CIRCUIT

(75) Inventors: Amarildo J. C. Vieira, Philadelphia, PA (US); Mani Ramachandran, San Jose, CA (US); Arthur Paolella, Jamison, PA (US)

(73) Assignee: General Instrument Corporation, Horsham, PA (US)

( * ) Notice: Subject to any disclaimer, the term of this patent is extended or adjusted under 35 U.S.C. 154(b) by 94 days.

(21) Appl. No.: 10/774,308

(22) Filed: Feb. 6, 2004

(65) Prior Publication Data

US 2005/0175354 A1    Aug. 11, 2005

(51) Int. Cl.
*H04B 10/02* (2006.01)

(52) U.S. Cl. ............ 398/176; 398/175; 398/152; 398/65; 398/79; 359/326; 359/332; 359/333; 359/330; 359/331; 359/344; 385/1; 385/2; 385/4; 385/5; 385/15

(58) Field of Classification Search .......... 398/152, 398/175, 176, 65, 79; 386/5; 359/344, 326, 359/332, 330, 331, 333; 385/1, 2, 4, 5, 15
See application file for complete search history.

(56) References Cited

U.S. PATENT DOCUMENTS

| | | | | |
|---|---|---|---|---|
| 5,754,714 A | * | 5/1998 | Suzuki et al. | 385/5 |
| 6,195,188 B1 | * | 2/2001 | Sekiguchi | 398/152 |
| 6,335,819 B1 | * | 1/2002 | Cho et al. | 359/333 |
| 6,532,091 B1 | * | 3/2003 | Miyazaki et al. | 398/175 |
| 2002/0075558 A1 | * | 6/2002 | Kim et al. | 359/332 |
| 2003/0231382 A1 | * | 12/2003 | Ahn et al. | 359/344 |

OTHER PUBLICATIONS

Blumenthal, D.J., "WDN Crossconnects in DWDM Transmission Environments," OFC Short Course, pp. 37-48, 51-52 (Mar. 2003).
White, Ian, "Wavelength Switching Components for Future Photonic Networks," IEEE Communications Magazine, pp. 74-81 (Sep. 2002).
"Record Short Wavelength for Nd:YVO$_4$ Laser," Laser Focus World, p. 42 (Sep. 1999).

* cited by examiner

*Primary Examiner*—Hanh Phan
(74) *Attorney, Agent, or Firm*—Lawrence T. Cullen

(57) ABSTRACT

A method and apparatus for transferring information of an optical information-bearing signal from a first wavelength to a second wavelength. The method is implemented in an all-optical wavelength converter circuit which includes a laser diode in communication with a polarization controller. An information-bearing signal having a first wavelength is input to the circuit. A polarization controller adjusts the polarization of the information-bearing signal. The laser diode receives the polarization-adjusted information-bearing signal and generates a converted information-bearing signal by transferring the information of the polarization-adjusted information-bearing signal from the first wavelength to the second wavelength. The polarization controller receives the converted information-bearing signal from the laser diode, and polarizes the converted information-bearing signal.

17 Claims, 3 Drawing Sheets

ALL-OPTICAL WAVELENGTH CONVERTER CIRCUIT

BACKGROUND OF THE INVENTION

1. Field of the Invention

The present invention generally relates to an optical circuit that transfers information of an incoming information-bearing signal from a first wavelength to a second wavelength.

2. Background Information

Optical communication systems provide significant communications capacity using a point-to-point architecture, whereby one transmitter is connected directly to a remote receiver through a single optical fiber. One widely accepted approach used to further expand such communications capacity is implemented using a Wavelength Division Multiplex ("WDM") system. In a WDM system, sources with different wavelengths (colors) used to carry their own information are combined and transmitted through a single optical fiber. Therefore, a WDM system employing 16 different wavelengths channels can increase the capacity of the optical fiber by 16 fold.

As optical systems evolve and become optical networks with more complex topologies (e.g., ring, star, etc.), there is a need to find ways to manage different channels having different wavelengths. Wavelength converters are used in dynamic and standard WDM networks to optically transfer information from one wavelength carrier to another. Such wavelength converters add flexibility to the networks by routing and reconfiguring channels therein.

Some current wavelength converters, also known as optical transponders, process an incoming optical signal at a first wavelength by converting the optical signal to an electrical signal. The electrical signal is then regenerated back to the optical domain at a different wavelength (i.e., Optical-Electrical-Optical, or OEO). This process is expensive, complex and has limited applications since it is limited to operating at a specific data rate.

Other known wavelength converters implement an all-optical methodology which uses techniques such as Four-Wave Mixing ("FWM"), Cross-Phase Modulation, Cross-Gain Modulation ("XGM"), or the like. These techniques require complex circuitry and are inefficient, thus leading to high conversion loss. For example, known wavelength converters which use XGM generally require a semiconductor optical amplifier ("SOA") acting as a mixer in addition to a laser used as an oscillator. Such systems tend to be complicated and costly.

SUMMARY OF THE INVENTION

Briefly stated, according to a first aspect of the present invention, a method uses an optical circuit to transfer information of an information-bearing signal from a first wavelength to a second wavelength. The optical circuit has an input port, an output port, and a polarization controller in communication with a laser diode. The method includes inputting an information-bearing signal having a first wavelength into the input port. The polarization controller receives the information-bearing signal and adjusts the polarization of the information-bearing signal. The laser diode receives the polarization-adjusted information-bearing signal from the polarization controller and generates a converted information-bearing signal by transferring the information of the polarization-adjusted information-bearing signal from the first wavelength to the second wavelength. The converted information-bearing signal is output from the output port.

According to a second aspect of the present invention, an all-optical wavelength converter circuit for transferring information of an information-bearing signal from a first wavelength to a second wavelength includes a polarization controller for receiving an information-bearing signal having the first wavelength and adjusting the polarization of the information-bearing signal. A laser diode in communication with the polarization controller generates a converted information-bearing signal by transferring the information of the polarization-adjusted information-bearing signal from the first wavelength to the second wavelength.

According to a third aspect of the present invention, an all-optical wavelength converter circuit for transferring information of an information-bearing signal from a first wavelength to a second wavelength includes a laser diode in communication with the information-bearing signal. The laser diode transfers the information of the information-bearing signal from the first wavelength to the second wavelength using cross-gain modulation.

According to a fourth aspect of the present invention, an optical wavelength switch comprises an input for receiving at least a first information-bearing signal having a first wavelength and a second information-bearing signal having a second wavelength. The switch includes at least two all-optical wavelength converter circuits. Each wavelength converter circuit includes a laser diode. The laser diode of one of the wavelength converter circuits is in communication with one of the first and second information-bearing signals. The laser diode of the other of the wavelength converter circuits is in communication with the other of the first and second information-bearing signals. The laser diode in each of the wavelength converter circuits transfers information of the respective information-bearing signal to another wavelength using cross-gain modulation. The switch includes an output for transmitting the first and second information-bearing signals, such that the first information-bearing signal has the second wavelength and the second information-bearing signal has the first wavelength.

BRIEF DESCRIPTION OF THE DRAWINGS

The following detailed description of preferred embodiments of the present invention would be better understood when read in conjunction with the appended drawings. For the purpose of illustrating the present invention, there are shown in the drawings embodiments which are presently preferred. However, the present invention is not limited to the precise arrangements and instrumentalities shown. In the drawings.

DETAILED DESCRIPTION OF THE INVENTION

Figure 1:
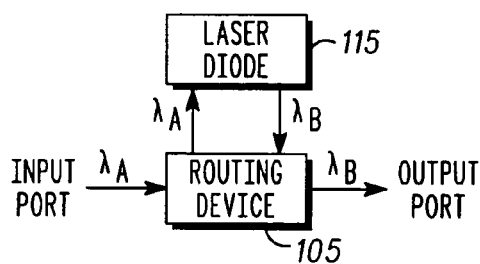
FIG. 1 is a block diagram of an all-optical wavelength converter circuit in accordance with a first preferred embodiment of the present invention.

Referring to FIG. 1, an all-optical wavelength converter circuit, generally designated 100, in accordance with a first preferred embodiment of the present invention is shown. The converter circuit 100 transfers information of an incoming information-bearing signal from a first wavelength $\lambda_A$ to a second wavelength $\lambda_B$. In the description that follows, the phrase "wavelength conversion" and references thereto are used interchangeably with and have the same meaning as "transferring information of an information-bearing signal from a first wavelength to a second wavelength."

The wavelength converter circuit 100 includes a laser diode 115 which is used as a gain medium that internally generates a probe continuous wave signal $\lambda_B$, rather than receiving the probe signal from an external source as in conventional wavelength converter circuits. The incoming information-bearing signal having the first wavelength is preferably routed through a routing device 105 and coupled to gain medium of the laser diode 115. The routing device 105 may be an optical circulator, an optical directional coupler, an optical diplexer, an optical beamsplitter or any other device generally known in the art for routing an optical signal. A multiplex device may also be used to separate the first and second wavelengths. The incoming information-bearing signal may also be directly coupled to the laser diode 115 through back-facet coupling and/or through side coupling. The information-bearing signal may be in the form of either a digital information signal or an analog information signal.

According to the present invention, the laser diode 115 is preferably a non-isolated distributed feedback ("DFB") laser diode with high slope efficiency and high threshold current. Using such a DFB laser makes it easier to couple the incoming signal into the gain medium of the laser diode 115 by providing high laser-fiber coupling and high laser output coupling, respectively. The laser diode 115 preferably has side modes having a WDM frequency spacing that matches an International Telecommunications Union ("ITU") grid channel spacing (e.g., 50 and 100 GHz) to facilitate easier coupling of an incoming signal. The laser diode 115 may be tuned by adjusting an input bias current $I_b$, and by adjusting the temperature of the laser. Alternatively, the laser diode 115 may be a Fabry-Perot laser diode, an external cavity laser, a pulsed laser diode, a solid-state laser (e.g., microchip laser) or a fiber laser without departing from the spirit and scope of the present invention.

Unlike conventional wavelength converter circuits (e.g., those circuits which depend on SOAs), the wavelength conversion of the information-bearing signal according to the present invention preferably takes place within the laser diode 115 itself. In the present invention, the laser diode 115 preferably functions as both a mixer and an oscillator. The laser diode 115 preferably uses the gain depletion process of XGM taking place in the gain medium of the laser diode 115 to complete the conversion. Thus, conversion efficiency is maximized by using minimal input power to transfer information from the first wavelength $\lambda_A$ (e.g., 1550.92 nm, channel 33 of the ITU grid) to the second wavelength $\lambda_B$ (e.g., 1560.61 nm, channel 21 of the ITU grid). The wavelength conversion may be extended between different optical communication windows as well, allowing for conversion between the 1310 and 1550 nm windows, and vice-versa. Preferably, the wavelength conversion is implemented completely within the optical domain, independent of the data rate of the information-bearing signal. Thus, the wavelength converter circuit 100 provides additional flexibility and cost savings compared to conventional wavelength circuits.

Figure 2:
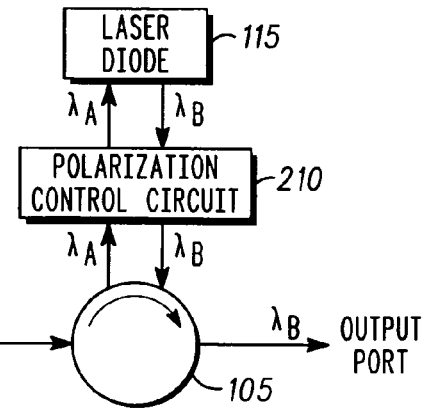
FIG. 2 is a block diagram of an all-optical wavelength converter circuit in accordance with a second preferred embodiment of the present invention.

Referring to FIG. 2, an all-optical wavelength converter circuit, generally designated 200, in accordance with a second preferred embodiment of the present invention is shown. Elements in the converter circuit 200 which are similar to those discussed with respect to the converter circuit 100 are labeled with the same reference numerals.

The wavelength converter circuit 200 includes a polarization control circuit 210 which receives the information-bearing signal having the first wavelength $\lambda_A$. The polarization controller 210 is in communication with the laser diode 115, such that the information-bearing signal input to the converter circuit 200 undergoes a polarization process prior to being input to the laser diode 115. Since the laser diode may be polarization sensitive, adjusting the polarization of the information-bearing signal so that it matches the polarization of the laser diode 115 reduces loss of the signal during conversion. The wavelength of the information-bearing signal at the first wavelength may also be adjusted to match one of the side-modes of the converting laser, thereby increasing the coupling coefficient and the XGM phenomenon, and consequently reducing the conversion loss. The first wavelength may also be slightly off the side-mode wavelength to take into consideration any laser detuning effect due to the XGM.

The laser diode 115 generates a converted information-bearing signal by changing the first wavelength $\lambda_A$ of the polarization-adjusted information-bearing signal to the second wavelength $\lambda_B$, similar to the converter circuit 100. After conversion, the laser diode 115 transmits the converted information-bearing signal to the polarization controller 210 which adjusts the polarization of the converted information-bearing signal. The wavelength converter circuit 200 thus allows the use of low cost, commercially available off-the-shelf laser diodes which provide optimum power transfer efficiency, thereby minimizing conversion loss. Alternatively, instead of using a polarization controller 210, a laser diode 115 having a symmetrical or quasi-symmetrical gain medium cross-section is also suitable as the conversion medium, and would relax or avoid the need of a polarization controller, while still minimizing conversion loss. Those skilled in the art will recognize that the polarization of the converted information-bearing signal need not be adjusted after being output from the laser diode 115 if there are no additional elements in the converter circuit 200 which are polarization sensitive. That is, the converted information-bearing signal may be output from the laser diode 115, bypassing the polarization controller 210, directly to the router 105 for transmission to the output port (see, for example, FIG. 6).

Figure 3:
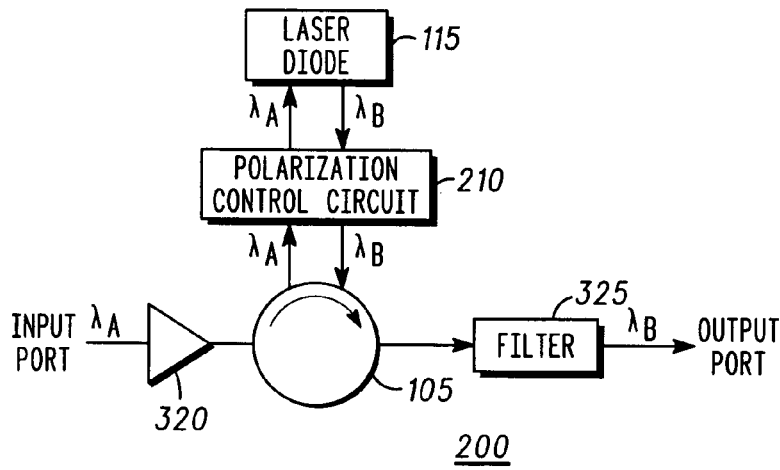
FIG. 3 is a block diagram of the converter circuit of FIG. 2 having an amplifier at the input of the circuit and a filter at the output of the circuit.
Figure 4:
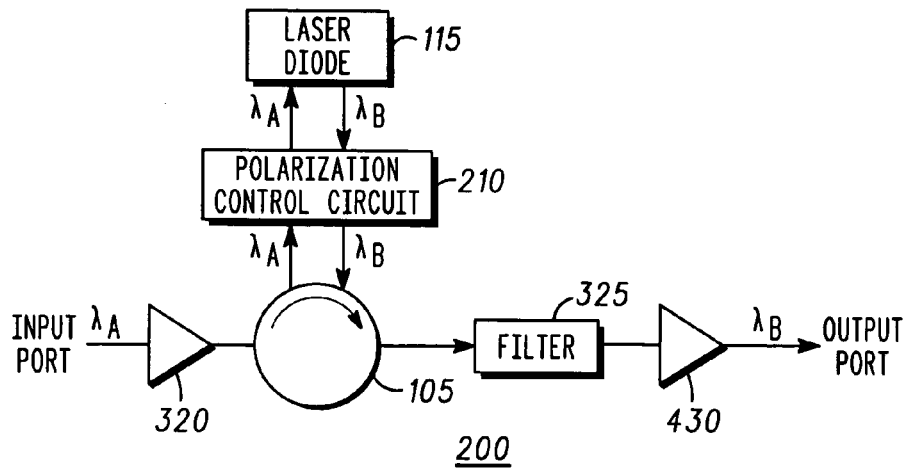
FIG. 4 is a block diagram of the converter circuit of FIG. 2 having a first amplifier at the input of the circuit, and a filter and a second amplifier at the output of the circuit.
Figure 5:
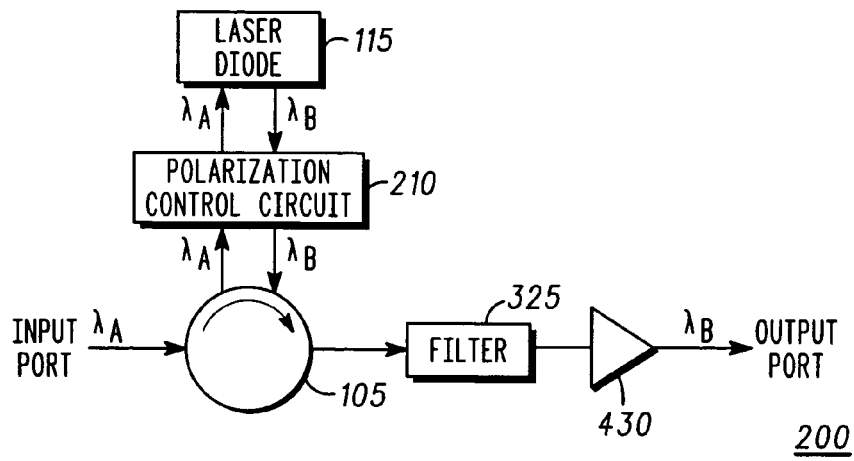
FIG. 5 is a block diagram of the converter circuit of FIG. 2 having a filter and an amplifier at the output of the circuit.

Referring to FIGS. 3–5, variations of the wavelength converter circuit 200 are shown. In FIG. 3 the incoming information-bearing signal having the first wavelength $\lambda_A$ is preferably amplified by an amplifier 320 prior to being input to the routing device 105. The wavelength converter circuit 200 may also include an optical bandpass filter 325 which selects the second wavelength $\lambda_B$ if higher suppression of the first wavelength $\lambda_A$ is required. The filter 325 may, for example, be a tunable optical bandpass filter ("TOBPF"). Thus, the routing device 105 directs the information-bearing signal having the first wavelength to the polarization controller 210, and directs the converted information-bearing signal to the filter 325. Those skilled in the art will recognize that the wavelength converter circuit 200 of FIG. 3 may be implemented with an additional amplifier 430, such that the filtered converted information-bearing signal is also amplified at the output port (see FIG. 4). Alternatively, the wavelength converter circuit 200 may not amplify the incoming information-bearing signal prior to conversion, while still including the filter 325 and the amplifier 430 to filter and amplify the converted information-bearing signal (see FIG. 5). As noted above, any of the variations of the converter circuit 200 shown in FIGS. 3–5 may couple the converted information-bearing signal directly to the router 105, bypassing the polarization controller 210.

The wavelength converter circuits 100, 200 discussed with reference to FIGS. 1–5 output the converted information-bearing signal with a data signal which is inverted with respect to the information-bearing signal having the first wavelength. In some instances, the device receiving the converted information-bearing signal may be sensitive to such an inverted data signal. Thus, two wavelength converters 100, 200 may be cascaded back to back (not shown), thereby re-inverting the data signal of the converted information-bearing signal and producing a second converted information-bearing signal which has a wavelength which is different than the first wavelength, but which retains the original, un-inverted data signal.

Those skilled in the art will also recognize that the wavelength converter circuits 100, 200 discussed above may be implemented with devices or elements designed to increase the signal to noise ratio of the converted information-bearing signal upon output from the laser diode 115.

Figure 6:
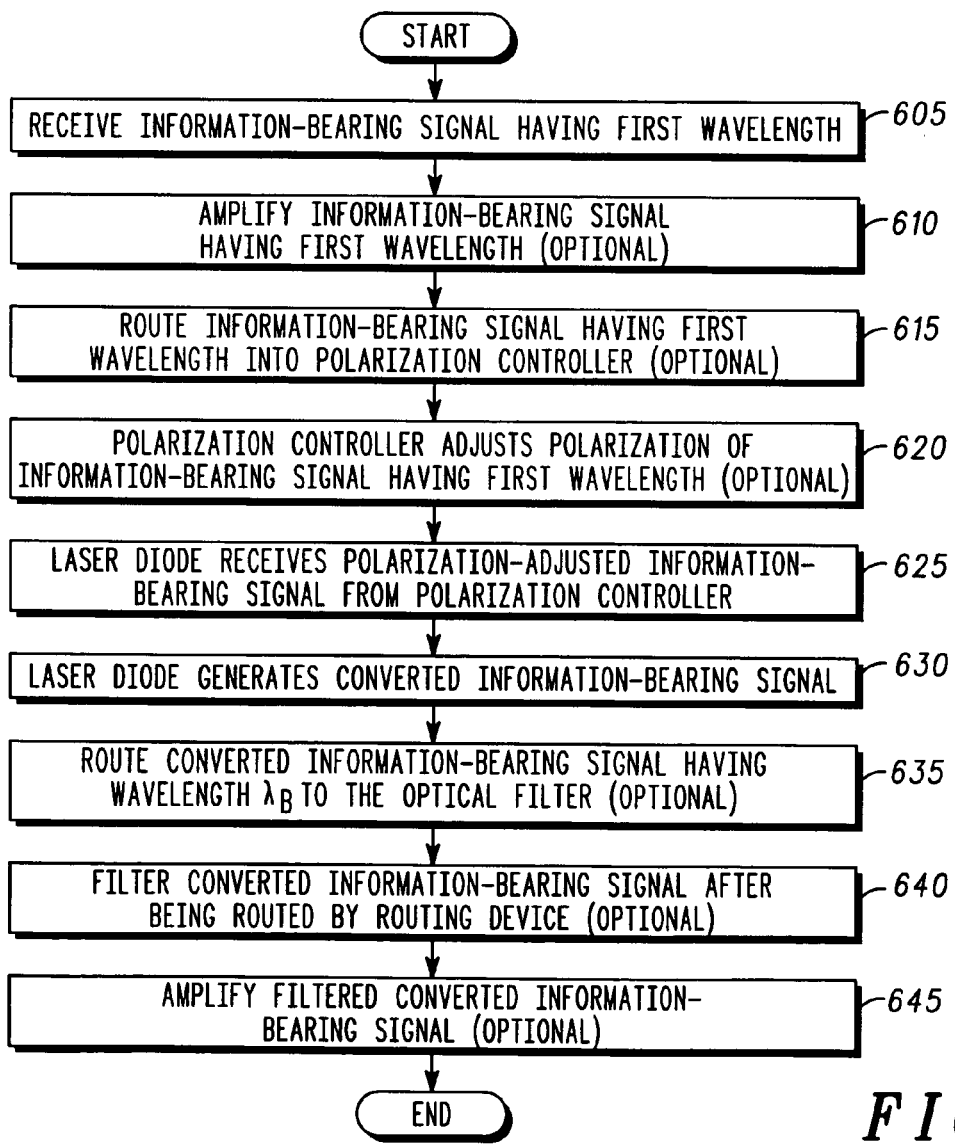
FIG. 6 is a flow chart showing a preferred method for carrying out the present invention.

A preferred method of converting the wavelength of an information-bearing signal to another wavelength in accordance with the present invention is shown in the flow chart of FIG. 6. The method uses an optical circuit, such as any of the all-optical wavelength converter circuits as previously discussed with respect to FIGS. 1–5 which convert the wavelength $\lambda_A$ of an information-bearing signal to another wavelength $\lambda_B$. The steps in FIG. 6 are mostly self-explanatory, and thus no detailed discussion of each step is provided. However, all or portions of steps 610, 615, 620, 635, 640 and 645 are optional or may be altered depending upon the particular configuration of the wavelength converter circuit 100, 200 being used. That is, as previously described, the wavelength converter circuits 100, 200 may include different combinations of a polarization controller 210, a filter 325 and amplifiers 320, 430. Thus, the method of FIG. 6 could be implemented simply using steps 605, 625 and 630 (reflecting the converter circuit 100 of FIG. 1) without departing from the spirit and scope of the present invention.

Figure 7:
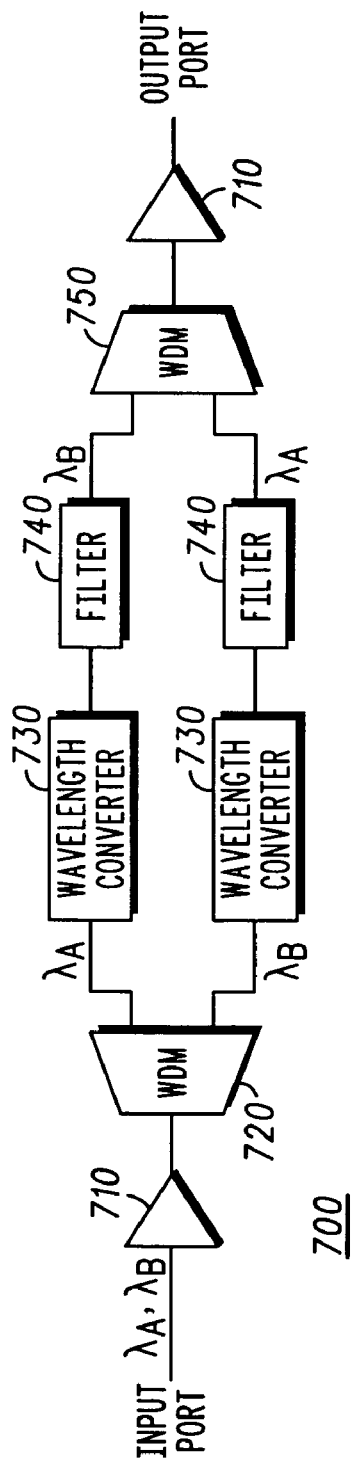
FIG. 7 is a block diagram of a wavelength switch in accordance with a third preferred embodiment of the present invention.
Figure 8:
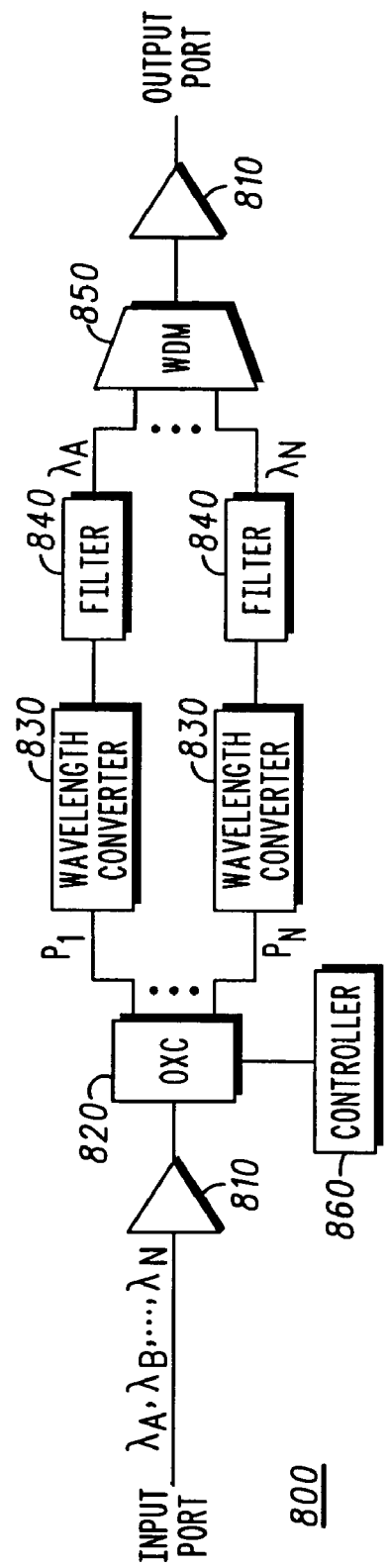
FIG. 8 is a block diagram of a wavelength switch in accordance with a fourth preferred embodiment of the present invention.

Referring to FIGS. 7 and 8, optical cross connect ("OXC") devices formed from wavelength converters in accordance with the present invention are shown. FIG. 7 shows a wavelength switch, generally designated 700, which includes two multiplexed incoming information-bearing signals having wavelengths $\lambda_A$ and $\lambda_B$. The information-bearing signals are optionally amplified by an optical amplifier 710 and separated by an optical WDM filter 720. The information-bearing signal having initial wavelength $\lambda_A$ is applied to a wavelength converter 730, which is similar to the converters 100, 200 discussed above, such that the information is transferred to a signal having a final wavelength $\lambda_B$. An optical bandpass filter 740 may also be included to select the final wavelength $\lambda_B$ if higher suppression of the initial wavelength $\lambda_A$ is required. Similarly, the information-bearing signal having initial wavelength $\lambda_B$ is applied to a second wavelength converter 730, which transfers the information to a signal having a final wavelength $\lambda_A$. A second optical bandpass filter 740 may also be included to help select the final wavelength $\lambda_A$ if higher suppression of the initial wavelength $\lambda_B$ is required. The two final wavelengths are optionally recombined using a WDM filter 750 and amplified by a second amplifier 710. The converted signals are output via an output port of the wavelength switch 700.

Similar to the wavelength switch 700, FIG. 8 shows an array of all-optical wavelength converters forming an wavelength switch 800, in accordance with another embodiment of the present invention. A set of N multiplexed incoming information-bearing signals having wavelengths $\lambda_A$ to $\lambda_N$ are amplified by an optional optical amplifier 810 and separated by an OXC device 820 according to instructions from a controller 860. The OXC device 820 determines to which port, $P_1$ to $P_N$, each incoming information-bearing signal is connected, and thus to which of the N available wavelengths each incoming signal is converted. The information-bearing signal having an initial wavelength $\lambda_A$ is thus applied to a wavelength converter 830, which is similar to the converters 100, 200 discussed above, such that the information is transferred to a signal having a final wavelength within the remaining N multiplexed wavelengths $\lambda_B$ to $\lambda_N$. The wavelength switch 800 may also include a optical bandpass filter 840 to select the desired final wavelength if higher suppression of the initial wavelength $\lambda_A$ is required. The wavelength conversion is realized for the other initial wavelengths in the same fashion, as specified by the controller 860. The final wavelengths are optionally recombined using a wavelength insensitive optical WDM filter 850 and amplified by a second amplifier 810. The converted signals are output via an output port of the wavelength switch 800. Many different configurations of the switches 700, 800 are possible without departing from the spirit and scope of the present invention, so long as the switches 700, 800 employ wavelength converters 730, 830 which are similar to the converters 100, 200 described above.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. An all-optical wavelength converter circuit for transferring information of an information-bearing signal from a first wavelength to a second wavelength, the wavelength converter circuit comprising;
   (a) a polarization controller for (i) receiving an information-bearing signal having the first wavelength, and (ii) adjusting the polarization of the information-bearing signal; and
   (b) a laser diode in communication with the polarization controller, the laser diode generating a converted information-bearing signal using cross gain modulation in the laser diode to transfer the information of the polarization-adjusted information-bearing signal from the first wavelength to the second wavelength,
   wherein the laser diode is a pulsed laser diode.

2. The all-optical wavelength converter circuit of claim 1 further comprising:
(c) at least one filter for filtering the converted information-bearing signal to suppress or eliminate the first wavelength; and
(d) a routing device in communication with the polarization controller and the filter, the routing device (i) directing the information-bearing signal having the first wavelength to the polarization controller, and (ii) directing the converted information-bearing signal to the filter.

3. The all-optical wavelength converter circuit of claim 2 further comprising:
(e) an amplifier in communication with the routing device for amplifying the information-bearing signal having a first wavelength.

4. The all-optical wavelength converter circuit of claim 2 further comprising:
(e) an amplifier in communication with the filter for amplifying the filtered converted information-bearing signal.

5. The all-optical wavelength converter circuit of claim 2 wherein the routing device is an optical circulator.

6. The all-optical wavelength converter circuit of claim 2 wherein the routing device is an optical directional coupler.

7. The all-optical wavelength converter circuit of claim 1 further comprising:
(c) a routing device in communication with the polarization controller, the routing device (i) directing the information-bearing signal having the first wavelength to the polarization controller, and (ii) directing the converted information-bearing signal to a filter; and
(d) an amplifier in communication with the routing device for amplifying the converted information-bearing signal.

8. The all-optical wavelength convener circuit of claim 1 wherein the laser diode transmits the converted information-bearing signal to the polarization controller which adjusts the polarization of the converted information-bearing signal.

9. An all-optical wavelength converter circuit for transferring information of an information-bearing signal from a first wavelength to a second wavelength, the wavelength converter circuit comprising:
(a) a polarization controller for (i) receiving an information-bearing signal having the first wavelength, and (ii) adjusting the polarization of the information-bearing signal; and
(b) a laser diode in communication with the polarization controller, the laser diode generating a converted information-bearing signal using cross gain modulation in the laser diode to transfer the information of the polarization-adjusted information-bearing signal from the first wavelength to the second wavelength,
wherein the laser diode is a fiber laser diode.

10. The all-optical wavelength converter circuit of claim 9 further comprising:
(c) at least one filter for filtering the converted information-bearing signal to suppress or eliminate the first wavelength; and
(d) a routing device in communication with the polarization controller and the filter, the routing device (i) directing the information-bearing signal having the first wavelength to the polarization controller, and (ii) directing the converted information-bearing signal to the filter.

11. The all-optical wavelength converter circuit of claim 10 further comprising:
(e) an amplifier in communication with the routing device for amplifying the information-bearing signal having a first wavelength.

12. The all-optical wavelength converter circuit of claim 10 further comprising:
(e) an amplifier in communication with the filter for amplifying the filtered converted information-bearing signal.

13. The all-optical wavelength converter circuit of claim 10 wherein the routing device is an optical circulator.

14. The all-optical wavelength converter circuit of claim 10 wherein the routing device is an optical directional coupler.

15. The all-optical wavelength converter circuit of claim 9 further comprising:
(c) a routing device in communication with the polarization controller, the routing device (i) directing the information-bearing signal having the first wavelength to the polarization controller, and (ii) directing the converted information-bearing signal to the filter; and
(d) an amplifier in communication with the routing device for amplifying the converted information-bearing signal.

16. The all-optical wavelength converter circuit of claim 9 wherein the laser diode transmits the converted information-bearing signal to the polarization controller which adjusts the polarization of the converted information-bearing signal.

17. An optical wavelength switch comprising:
an input for receiving at least a first information-bearing signal having a first wavelength and a second information-bearing signal having a second wavelength;
at least two all-optical wavelength converter circuits, each wavelength converter circuit including a laser diode, the laser diode of one of the at least two wavelength converter circuits being in communication with one of the at least first and second information-bearing signals, the laser diode of the other of the at least two wavelength converter circuits being in communication with the other of the at least first and second information-bearing signals, wherein the laser diode in each of the wavelength converter circuits transfers information of the respective information-bearing signal to another wavelength using cross-gain modulation in the laser diode; and
an output for transmitting the at least first and second information-bearing signals, wherein the first information-bearing signal has the second wavelength and the second information-bearing signal has the first wavelength,
wherein the all optical wavelength converter circuits include a polarization controller which adjusts the polarization of the information-bearing signal in communication with the laser diode prior to the laser diode transferring the information of the respective information-bearing signal to another wavelength, and
wherein the laser diode is a pulsed laser diode or a fiber laser diode.

* * * * *